United States Patent
Chen (10) Patent No.: US 12,263,669 B2
(45) Date of Patent: Apr. 1, 2025

(54) COMPOSITE HEAT DISSIPATION MATERIAL

(71) Applicant: WAH HONG INDUSTRIAL CORP., Kaohsiung (TW)

(72) Inventor: Ko-Chun Chen, Kaohsiung (TW)

(73) Assignee: WAH HONG INDUSTRIAL CORP., Kaohsiung (TW)

( * ) Notice: Subject to any disclaimer, the term of this patent is extended or adjusted under 35 U.S.C. 154(b) by 282 days.

(21) Appl. No.: 17/659,663

(22) Filed: Apr. 19, 2022

(65) Prior Publication Data
US 2022/0379583 A1    Dec. 1, 2022

(30) Foreign Application Priority Data
May 26, 2021    (TW) .................. 110119020

(51) Int. Cl.
| | |
|---|---|
| B32B 9/00 | (2006.01) |
| B32B 7/12 | (2006.01) |
| B32B 9/04 | (2006.01) |
| H05K 7/20 | (2006.01) |

(52) U.S. Cl.
CPC ............... *B32B 9/007* (2013.01); *B32B 7/12* (2013.01); *B32B 9/041* (2013.01); *B32B 2307/302* (2013.01); *H05K 7/2039* (2013.01)

(58) Field of Classification Search
CPC .............. B32B 9/007; B32B 2307/302; B32B 9/041; B32B 7/12; H05K 7/2039
See application file for complete search history.

(56) References Cited

U.S. PATENT DOCUMENTS

| | | | | |
|---|---|---|---|---|
| 2014/0043769 A1* | 2/2014 | Chang | ................ | H05K 7/2039 |
| | | | | 361/720 |
| 2015/0130098 A1* | 5/2015 | Hsiang | ............... | C08G 73/1071 |
| | | | | 528/340 |

FOREIGN PATENT DOCUMENTS

| | | | | |
|---|---|---|---|---|
| CN | 102795617 A | * | 11/2012 | |
| CN | 103231554 A | | 8/2013 | |
| CN | 203761753 U | * | 8/2014 | |
| CN | 104097361 A | | 10/2014 | |
| CN | 104427048 B | | 8/2019 | |
| JP | 6361022 B2 | | 7/2018 | |
| JP | 6406760 B2 | | 10/2018 | |
| KR | 2015002191 A | * | 1/2015 | ............... B05D 3/12 |
| TW | 201515822 A | | 5/2015 | |

OTHER PUBLICATIONS

Translated_Li (Year: 2014).*
Translated_Mi (Year: 2015).*
Translated_Du (Year: 2012).*

* cited by examiner

*Primary Examiner* — Elizabeth J Martin
*Assistant Examiner* — Samba Nmn Gaye
(74) *Attorney, Agent, or Firm* — CKC & Partners Co., LLC (57) ABSTRACT

The composite heat dissipation material comprises at least one artificial graphite layer and a graphitic heat dissipation layer. The graphitic heat dissipation layer includes a graphite material layer, and the graphite material layer is not formed from artificial graphite materials. Further, the graphitic heat dissipation layer is bonded to the artificial graphite layer. The composite heat dissipation material of the present application can efficiently and rapidly dissipate heat energy produced from a heating source, thereby lowering temperature thereof.

12 Claims, 9 Drawing Sheets

COMPOSITE HEAT DISSIPATION MATERIAL

RELATED APPLICATIONS

This application claims priority to Taiwan Application Serial Number 110119020, filed May 26, 2021, which is herein incorporated by reference in its entirety.

BACKGROUND

Field of Invention

The present application relates to a heat dissipation material. More particularly, a heat dissipation material composited with different graphite materials is provided.

Description of Related Art

Electronic products become lighter and thinner as a progressing of technology, and have high-speed computing ability is necessary for the electronic products to meet requirements of applications. However, high-speed computing easily subjects devices to generate a huge amount of heat energy. If the heat energy cannot be timely dissipated and accumulates at electronic devices that are becoming smaller, the electronic devices will be damaged due to high temperature.

Metal materials with excellent heat conducting ability are generally used to efficiently dissipate the heat energy generated from the devices. However, the metal materials have not met requirements of lightweight as miniaturization of devices, and the metal materials are hard to form heat dissipation materials for miniaturized devices.

Accordingly, there is a need to provide a heat dissipation material for improving the defects of conventional heat dissipation material.

SUMMARY

Therefore, an aspect of the present application is to provide a composite heat dissipation material. The composite heat dissipation material can efficiently dissipate heat energy generated from a heat source with a configuration of an artificial graphite material and a graphite heat dissipation material, thereby preventing from damages due to high temperature. The composite heat dissipation material can be equipped with a three dimensional heat dissipation path by stacking multi-layers of artificial graphite materials and graphite heat dissipation materials, thereby more efficiently cooling the heat source.

According to the aforementioned aspect of the present application, the composite heat dissipation material is provided. The composite heat dissipation material comprises at least one first artificial graphite layer and a graphitic heat dissipation layer. The graphitic heat dissipation layer includes a graphite material layer, and the graphite material layer is not formed from an artificial graphite material. The graphitic heat dissipation layer is disposed on one side of the first artificial graphite layer, and the graphitic heat dissipation layer is bonded to one of the at least one of first artificial graphite layer. A difference value between a thermal conductivity coefficient of the graphite material layer and a thermal conductivity coefficient of each of the first artificial graphite layer is not less than 100 w/mK. The composite heat dissipation material is configured to dissipate a heat energy generated from the heat source. The composite heat dissipation material is directly bonded to the heat source, or there is a distance between the composite heat dissipation material and the heat source.

According to some embodiments of the present application, the aforementioned graphitic heat dissipation layer can selectively include a metal layer.

According to some embodiments of the present application, the aforementioned first artificial graphite layer is placed between the heat source and the graphitic heat dissipation layer.

According to some embodiments of the present application, the graphitic heat dissipation layer is placed between the heat source and the at least one first artificial graphite layer.

According to some embodiments of the present application, the graphitic heat dissipation layer is scarfed with the first artificial graphite layer by interspersing graphite.

According to some embodiments of the present application, the composite heat dissipation material can selectively include at least one second artificial graphite layer, and the at least one second artificial graphite layer is placed between the heat source and the graphitic heat dissipation layer.

According to some embodiments of the present application, a number of layers of the at least one second artificial graphite layer is larger than that of the at least one first artificial graphite layer.

According to some embodiments of the present application, a number of layers of the first artificial graphite layer is not more than eight.

According to some embodiments of the present application, the composite heat dissipation material can selectively include at least one adhesion layer. The at least one adhesion layer is disposed between the heat source and the composite heat dissipation material, and/or the adhesion layer is disposed between the graphitic heat dissipation layer and the at least one first artificial graphite layer.

According to some embodiments of the present application, each of the at least one adhesion layer includes a heat conduction material.

In the composite heat dissipation material of the present application, the composite heat dissipation material is composed of stacking artificial graphite layers and graphitic heat dissipation layers, thereby rapidly dissipating the heat energy generated from the heat source. The composite heat dissipation material can have a better heat dissipation efficiency with a multi-layers stack of artificial graphite materials. The graphitic heat dissipation layer can provide a z-axis heat conduction path to the composite heat dissipation material. The composite heat dissipation material can two-dimensionally conduct the heat energy with a combined configuration of the artificial graphite layer and the graphitic heat dissipation layer, and further the composite heat dissipation material can rapidly conduct the whole heat energy of x-y plane with the z-axis heat dissipating path. Therefore, the composite heat dissipation material of the present application can more efficiently dissipate the heat energy generated from the heat source and prevent from heat accumulation.

BRIEF DESCRIPTION OF THE DRAWINGS

The invention can be more fully understood by reading the following detailed description of the embodiment, with reference made to the accompanying drawings as follows:

FIG. 1A to FIG. 2C respectively illustrates a side view schematic of combining the composite heat dissipation material and the heat source according to some embodiments of the present application.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

The term "heat source" recited in the present application represents an element actually cooled by the composite heat dissipation material of the present application. Accordingly, the heat source can exemplarily be (1) a heating element which actually generates heat energy; (2) a high temperature element that needs to be further cooled because it is near a heating element which actually generates heat energy; and/or (3) a configuration comprising the aforementioned heating element and the high temperature element.

Figure 1A:
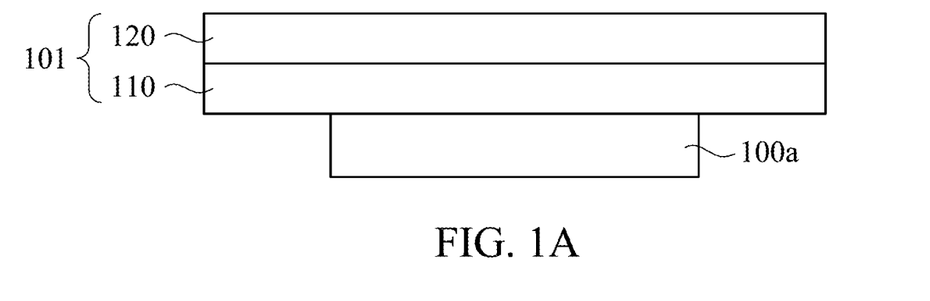

Referring to FIG. 1A, it illustrates a side view schematic of combining a composite heat dissipation material 101 and a heat element 100a according to some embodiments of the present application. The composite heat dissipation material 101 includes an artificial graphite layer 110 and a graphitic heat dissipation layer 120. The artificial graphite layer 110 is composed of one layer of an artificial graphite material. In some embodiments, the artificial graphite layer 110 can be composed of much more layers of the artificial graphite material. In other embodiments, the artificial graphite layer 110 can include the artificial graphite material less than or equal to eight layers. The artificial graphite layer 110 having one layer to eight layers of the artificial graphite material can simultaneously provide lower manufacturing cost and high heat dissipation efficiency.

In some embodiments, a thickness of the artificial graphite layer 110 can be 17 μm to 100 μm. For example, the thickness of the artificial graphite layer 110 can be 17 μm, 25 μm, 32 μm or 40 μm to 100 μm.

The graphitic heat dissipation layer 120 is disposed on the artificial graphite layer 110 and bonded to the artificial graphite layer 110. The graphitic heat dissipation layer 120 includes a graphite material layer, and the graphite material layer is not formed from an artificial graphite material. In some embodiments, the graphite material layer can be formed from a natural graphite material, other graphite materials, or a combination thereof. For example, the graphite material layer is formed from the natural graphite material. In some embodiments, a difference value between a thermal conductivity coefficient of the graphite material layer and that of each of the artificial graphite layer 110 is not less than 100 w/m K.

In some embodiments, the graphitic heat dissipation layer 120 can be bonded to the artificial graphite layer 110 by an adhesion layer (not illustrated). The adhesion layer can include acrylic type adhesives, other suitable adhesives, or a combination thereof. In these embodiments, the adhesion layer can selectively include a heat conduction material to improve heat conduction efficiency of the adhesion layer, thereby preventing from lowering heat dissipation efficacy of the composite heat dissipation material. For example, the heat conduction material can be graphite powders, metal micro spheres, other suitable heat conduction materials, or a combination thereof. Because the composite heat dissipation material of the present application is mainly constructed of graphite materials and there is a need to lower manufacturing cost, the aforementioned heat conduction material preferably can be the graphite powders. In other embodiments, the graphitic heat dissipation layer 120 is scarfed with the artificial graphite layer 110 by interspersing of the graphite materials, such that the graphite materials of the graphitic heat dissipation layer 120 can directly contacted the graphite materials of the artificial graphite layer 110, thereby decreasing interfaces of the heat dissipation to improve the heat dissipation efficiency of the composite heat dissipation material. In other words, in these embodiments, there is no an adhesion layer between the graphitic heat dissipation layer 120 and the artificial graphite layer 110.

In some embodiments, the artificial graphite layer 110 of the composite heat dissipation material 101 can be bonded to the heating element 100a with the adhesion layer (not illustrated). In these embodiments, the adhesion layer can be the same or different from the adhesion layer between the aforementioned graphitic heat dissipation layer 120 and the artificial graphite layer 110. There are no limitations to the heating element 100a, and it can be any elements which could produce heat energy.

In some embodiments, a bottom surface (i.e. the side bonded to the heating element 100a) of the artificial graphite layer 110 can selectively include an insulation film and/or other protecting films to prevent the composite heat dissipation material 101 from affecting electrical properties of a device and protect the composite heat dissipation material 101. It is noted that there is no insulation films and/or other protecting films at a bonding position of the artificial graphite layer 110 and the heating element 100a, thereby preventing from lowering heat dissipation efficacy of the composite heat dissipation material 101.

Although the composite heat dissipation material 101 illustrated in FIG. 1A is slightly larger than the heating element 100a, it is not intended to limit the present application. In some embodiments, the composite heat dissipation material 101 is horizontally extended along the surface bonded to the heating element 100a to enhance the heat dissipation efficacy of the composite heat dissipation material 101.

In FIG. 1A, the heat energy generated from the heating element 100a can be rapidly dissipated by the two-dimensional plane of the artificial graphite layer 110 extended along the heating element 100a because the artificial graphite layer 110 is bonded to the heating element 100a, thereby efficiently cooling the heating element 100a, and further preventing from heat accumulation. Therefore, it can prevent the heating element 100a from the damages resulted from the high temperature heat energy.

Figure 1B:
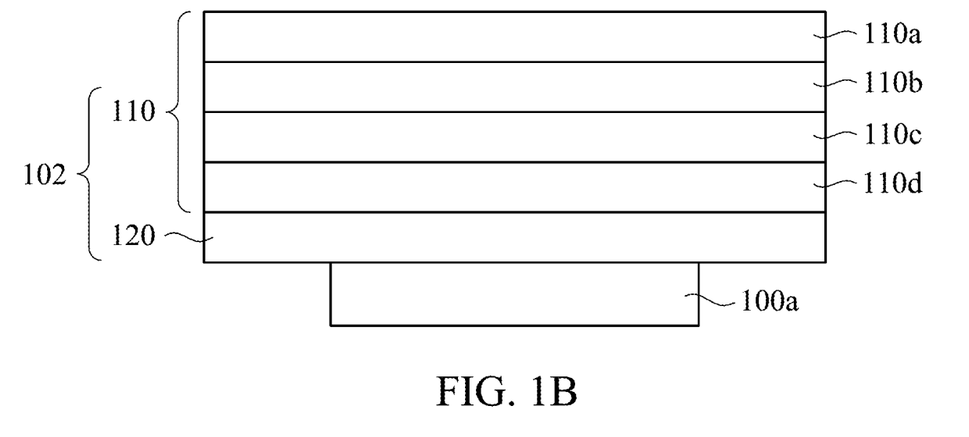

Referring to FIG. 1B, it illustrates a side view schematic of combining the composite heat dissipation material 102 and the heat element 100a according to some embodiments of the present application. The composite heat dissipation material 102 includes an artificial graphite layer 110 and a graphitic heat dissipation layer 120. Materials of the artificial graphite layer 110 and the graphitic heat dissipation layer 120 used in the composite heat dissipation material 102 are substantially the same as the aforementioned composite heat dissipation material 101 rather than focusing or mentioning them in details.

The artificial graphite layer 110 of the composite heat dissipation material 102 includes artificial graphite materials 110a, 110b, 110c and 110d, and the artificial graphite material 110d is bonded to the graphitic heat dissipation layer 120. In some embodiments, the artificial graphite material 110d can be bonded to the graphitic heat dissipation layer 120 by an adhesion layer, an interspersing of graphite, other suitable combining methods, or a combination thereof. Each of the artificial graphite material 110a, 110b, 110c and 110d can have the same or different thickness. Preferably, the artificial graphite layer 110 of the present application is merely stacked from artificial graphite material layers.

The composite heat dissipation material 102 is bonded to the heating element 100a by the graphitic heat dissipation layer 120. In some embodiments, an adhesion layer is selectively disposed between the graphitic heat dissipation layer 120 and the heating element 100a to improve the combination between those.

In FIG. 1B. Because the artificial graphite layer 110 of the composite heat dissipation material 102 includes a much more layers of artificial graphite materials, the artificial graphite layer 110 has a better heat dissipation efficiency with the stacking of the artificial graphite materials. In some embodiments, a total layer of the artificial graphite layer 110 in the composite heat dissipation material 102 is not more than eight layers for giving consideration to both of manufacturing cost and heat dissipation efficacy.

Figure 1C:
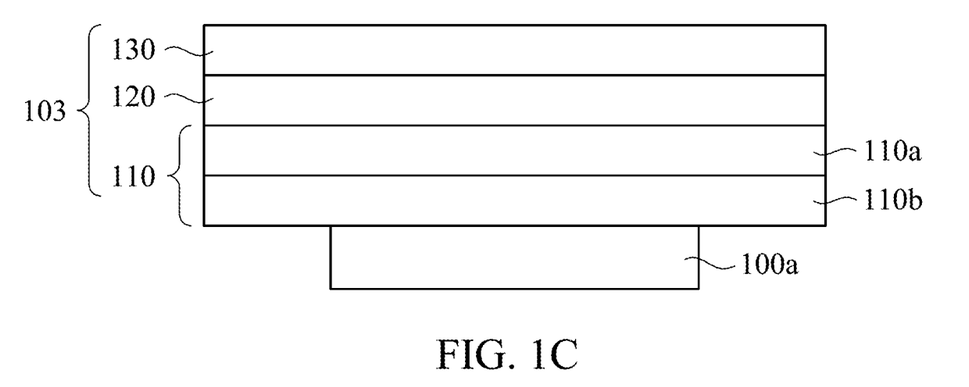

Referring to FIG. 1C, it illustrates a side view schematic of combining the composite heat dissipation material 103 and the heating element 100a according to some embodiments of the present application. The composite heat dissipation material 103 is substantially the same as the aforementioned composite heat dissipation material 101 in construction. Differences between those are that the artificial graphite layer 110 of the composite heat dissipation material 103 includes artificial graphite materials 110a and 110b, and the composite heat dissipation material 103 includes another artificial graphite layer 130. The artificial graphite layer 130 is bonded to the graphitic heat dissipation layer 120, and the graphitic heat dissipation layer 120 is disposed between the artificial graphite material 110a of the artificial graphite layer 110 and the artificial graphite layer 130.

Although the artificial graphite layer 130 in FIG. 1C has a single layer structure, it is not intended to limit the present application. In other embodiments, the artificial graphite layer 130 is formed from multi-layers of artificial graphite materials. In these embodiments, the artificial graphite layer 130 can include artificial graphite materials with a number of layers not more than eight. In some embodiments, the artificial graphite materials of the artificial graphite layer 110 have more layers than that of the artificial graphite layer 130. When the artificial graphite layer 110 has much more layers of the artificial graphite materials than the artificial graphite layer 130, the composite heat dissipation material 103 would have better heat dissipation efficiency.

Comparing to the composite heat dissipation material 102 of FIG. 1B, the artificial graphite material 110b of the composite heat dissipation material 103 can dissipate a huge amount of heat energy instantaneously generated from the heating element 100a because the heating element 100a in the composite heat dissipation material 103 is bonded to the artificial graphite material 110b of the artificial graphite layer 110. Therefore, the composite heat dissipation material 103 avoids damaging the heating element 100a due to the instantaneous high temperature heat energy.

Figure 2A:
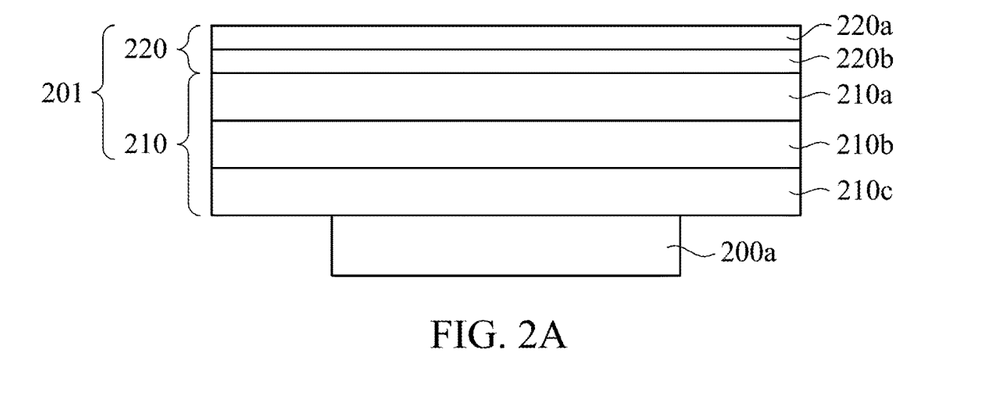

Referring to FIG. 2A, it illustrates a side view schematic of combining the composite heat dissipation material 201 and the heating element 200a according to some embodiments of the present application. The composite heat dissipation material 201 is substantially the same as the composite heat dissipation material 101 of FIG. 1A in construction. Differences between those are that the artificial graphite layer 210 of the composite heat dissipation material 201 includes artificial graphite materials 210a, 210b and 210c, and the graphitic heat dissipation layer 220 includes a graphite material layer 220a and a metal layer 220b. The metal layer 220b is much closer to the heating element 200a (i.e. the heat source) than the graphite material layer 220a for better heat dissipation efficiency. Thus, the metal layer 220b of the graphitic heat dissipation layer 220 is bonded to the artificial graphite material 210a in the composite heat dissipation material 201. In some embodiments, an adhesion layer is selectively disposed between the metal layer 220b and the artificial graphite material 210a.

In some embodiments, the artificial graphite layer 210 is merely stacked from artificial graphite material layers, such that the artificial graphite layer 210 of the present application does not have metallic material layers.

In some embodiments, the graphite material layer 220a of the graphitic heat dissipation layer 220 can include graphite materials with nanoscale crystal structures.

In the graphitic heat dissipation layer 220, the metal layer 220b can be formed on the graphite material layer 220a by electroplating, depositing, other suitable operations, or a combination thereof. For example, the metal layer 220b is formed on the graphite material layer 220a by a liquid-phase deposition processing (LPDP). In some examples, materials of the metal layer 220b can include copper, nickel, chromium, gold, silver, tin, platinum, other metal materials with high thermal conductivity coefficient, or a combination thereof. Because the graphite material layer 220a has an uneven stacking of graphite crystal, metal atoms of the metal layer 220b can penetrate into the stacking of graphite crystal, thereby scarfing the metal layer 220b and the graphite material layer 220a, and further improving bonding properties between those. Therefore, the heat conducting efficiency can be enhanced. In other words, the metal layer 220b is not merely physically stacked on the graphite material layer 220a. Embedded molecular microstructures are presented between the metal layer 220b and the graphite material layer 220a.

Comparing to the two dimensional (x-y plane) heat dissipation efficacy provided by the stacked graphite structure (e.g. the artificial graphite material 210a, 210b and 210c of the artificial graphite layer 210 and the graphite material layer 220a), when the graphitic heat dissipation layer 220 includes the metal layer 220b, the metal layer 220b can further provide a z-axis heat dissipating path to form a three dimensional (x-y-z) heat dissipation space because the metal materials has better thermal conductivity coefficient and the metal atoms are packed more tightly. Accordingly, the heat energy of the heating element 200a is firstly conducted in x-y plane, then conducted along z-axis (i.e. the metal layer 220b of the graphitic heat dissipation layer 220), and further conducted in x-y plane by the graphite material layer 220a. Therefore, the composite heat dissipation material 201 can efficiently dissipate a huge amount of heat energy generated instantaneous from heat source 200 with the combination of graphitic heat dissipation layer 220 having the metal layer 220b, thereby providing much better heat dissipation efficacy.

In some embodiments, a thickness of the graphitic heat dissipation layer 220 can be 30 μm to 500 μm, and preferably be 45 μm to 100 μm. For example, the thickness of the graphitic heat dissipation layer 220 can be 45 μm, 55 μm, 86 μm, 130 μm, 196 μm, 296 μm or 500 μm.

Figure 2B:
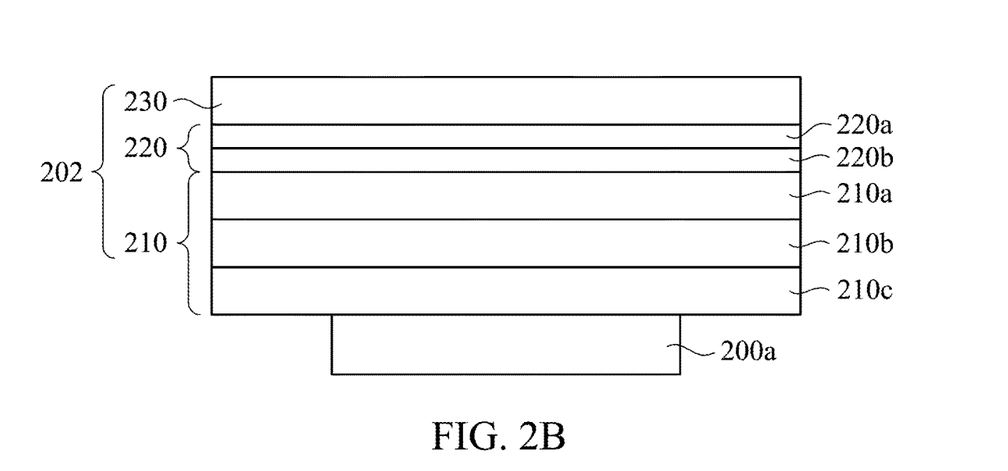

Referring to FIG. 2B, it illustrates a side view schematic of combining the composite heat dissipation material 202 and the heating element 200a according to some embodiments of the present application. The composite heat dissipation material 202 is substantially the same as the composite heat dissipation material 201 of FIG. 2A in construction. Differences between those are that the composite heat dissipation material 202 further includes an another artificial graphite layer 230, and the artificial graphite layer 230 is bonded to the graphite material layer 220a of the graphitic heat dissipation layer 220.

In the composite heat dissipation material 202, the heat energy generated from the heating element 200a can rapidly be conducted in the x-y plane by the artificial graphite layer 210, then conducted along z-axis in the metal layer 220b, and further being conducted in the x-y plane provided by the stacked graphite material layer 220a and the artificial graphite layer 230. Therefore, the heat energy generated from the heating element 200a is efficiently conducted by the composite heat dissipation material 202, thereby cooling the heating element 200a.

Although the artificial graphite layer 230 in FIG. 2B is illustrated as a single layer, it is not intended to limit the present application. In other embodiments, the artificial graphite layer 230 has multilayers of artificial graphite materials. The artificial graphite material of the artificial graphite layer 230 is not more than eight layers. It is noted that a number of layers of the artificial graphite materials of the artificial graphite layer 210 is more than that of the artificial graphite layer 230 to provide better heat dissipation efficiency because the artificial graphite layer 210 is much closer to the heating element 200a (i.e. the heat source).

Figure 2C:
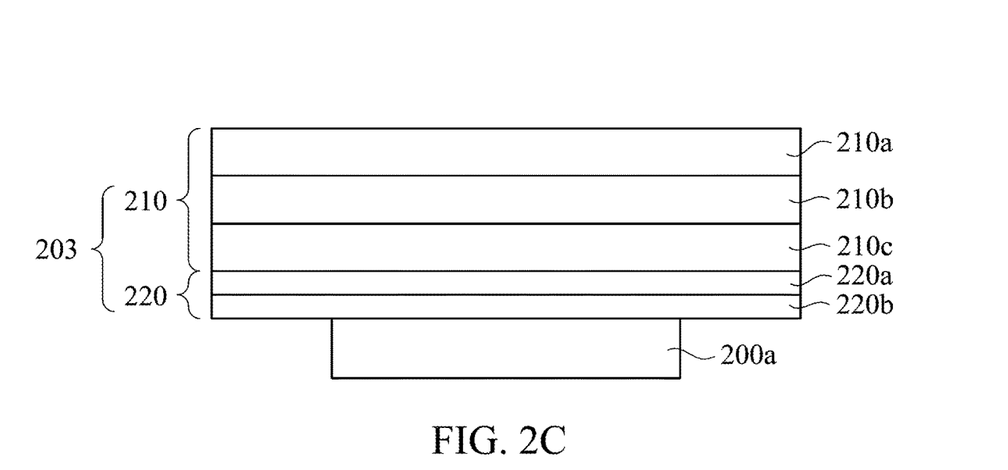

Referring to FIG. 2C, it illustrates a side view schematic of combining the composite heat dissipation material 203 and the heating element 200a according to some embodiments of the present application. The composite heat dissipation material 203 is substantially the same as the composite heat dissipation material 102 of FIG. 1B in construction. Differences between those are that the artificial graphite layer 210 of the composite heat dissipation material 203 comprises artificial graphite material 210a, 210b and 210c, and the graphitic heat dissipation layer 220 includes a graphite material layer 220a and a metal layer 220b.

The composite heat dissipation material 203 is bonded to the heating element 200a by the metal layer 220b of the graphitic heat dissipation layer 220. In some embodiments, the bonding between the metal layer 220b and the heating element 200a can be achieved by adhering, welding, other suitable operations, or a combination thereof.

Figure 3A:
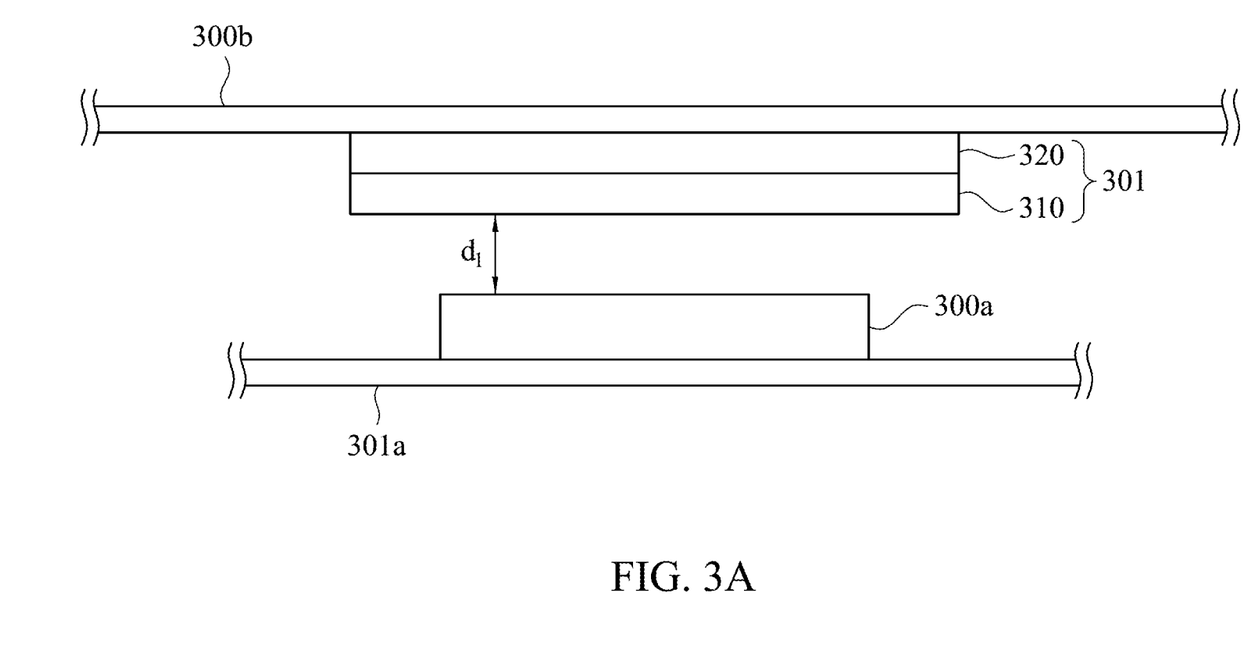
FIG. 3A to FIG. 3C respectively illustrates a side view schematic of a configuration of the composite heat dissipation material, a heating element and a high temperature element according to some embodiments of the present application.

Referring to FIG. 3A, it illustrates a side view schematic of a configuration of the composite heat dissipation material 301, a heating element 300a and a high temperature element 300b according to some embodiments of the present application. The heating element 300a is disposed on a component 301a, and the high temperature element 300b is close to the heating element 300a. The high temperature element 300b has higher temperature due to an influence of the heat energy produced from the heating element 300a. Accordingly, the composite heat dissipation material 301 is bonded to the high temperature element 300b for cooling the high temperature element 300b (i.e. the heat source).

The composite heat dissipation material 301 includes an artificial graphite layer 310 and a graphitic heat dissipation layer 320, and the artificial graphite layer 310 and the graphitic heat dissipation layer 320 are the same as the aforementioned artificial graphite layer 110 and the graphitic heat dissipation layer 120 in FIG. 1A rather than focusing or mentioning them in details. The composite heat dissipation material 301 of FIG. 3A is bonded to the high temperature element 300b by the graphitic heat dissipation layer 320. There is a distance d1 between the composite heat dissipation material 301 and the heating element 300a, such that the composite heat dissipation material 301 does not directly contact the heating element 300a. In some embodiments, the combination between the graphitic heat dissipation layer 320 and the high temperature element 300b is achieved by adhering, other suitable bonding operations, or a combination thereof. Temperature of the high temperature element 300b can be efficiently cooled with the composite heat dissipation material 301. In some examples, the high temperature element 300b can be a housing of a device. Therefore, the composite heat dissipation material 301 can efficiently cool the housing of the device.

In some embodiments, the component 301a is formed from heat dissipation materials. In other embodiments, the heating element 300a is selectively bonded to the aforementioned composite heat dissipation material of the present application, and the composite heat dissipation material is disposed between the heating element 300a and the composite heat dissipation material 301. Further, there is a distance d1 between the composite heat dissipation material and the composite heat dissipation material 301.

Figure 3B:
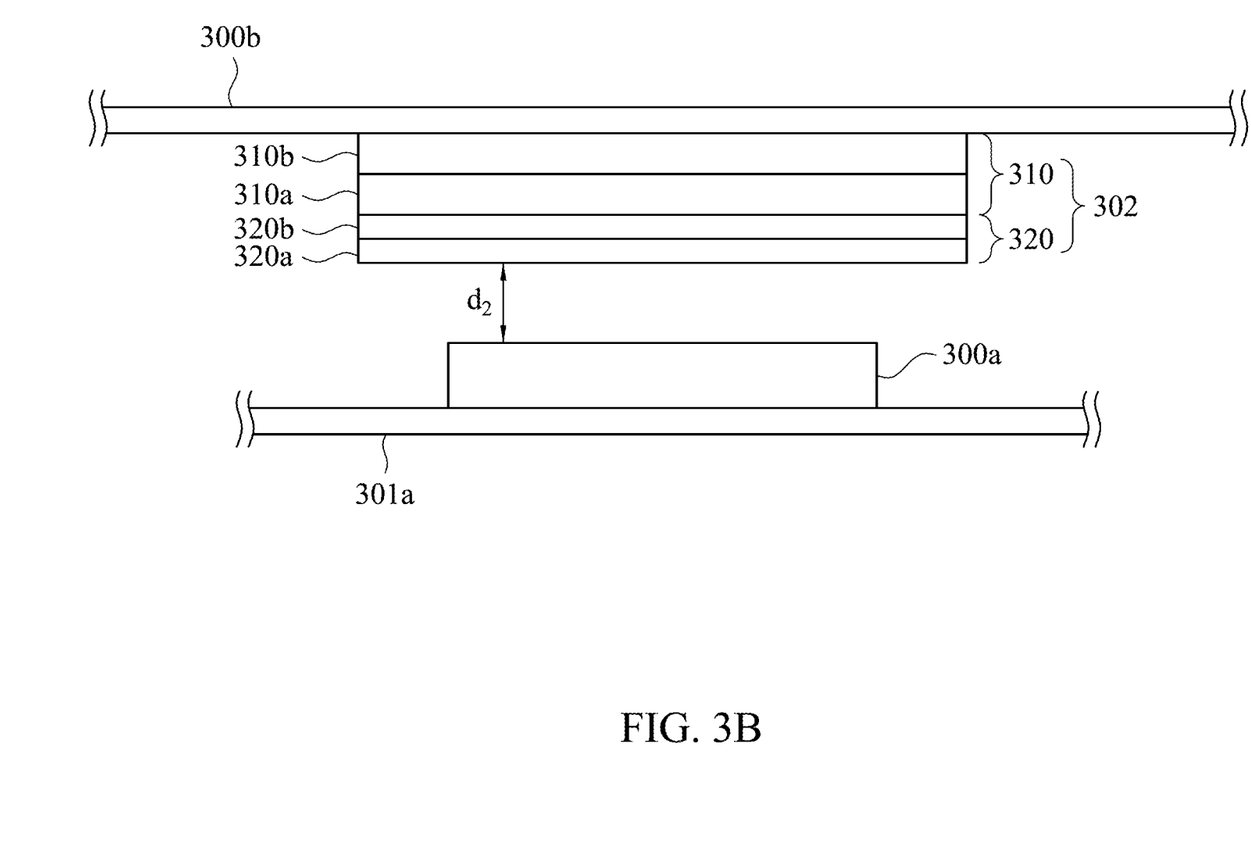

Referring to FIG. 3B, it illustrates a side view schematic of a configuration of the composite heat dissipation material 302, a heating element 300a and a high temperature element 300b according to some embodiments of the present application. The composite heat dissipation material 302 includes an artificial graphite layer 310 and a graphitic heat dissipation layer 320, and the graphitic heat dissipation layer 320 is disposed between the artificial graphite layer 310 and the high temperature element 300b. The artificial graphite layer 310 includes artificial graphite materials 310a and 310b while graphitic heat dissipation layer 320 includes a graphite material layer 320a and a metal layer 320b. The composite heat dissipation material 302 is bonded to the high temperature element 300b by the artificial graphite material 310b, and there is a distance d2 between the composite heat dissipation material 302 and the heating element 300a.

Comparing to the graphite material layer 320a, the metal layer 320b is closer to the high temperature element 300b for achieving better heat dissipation efficiency. When the heat energy of the high temperature element 300b is conducted in the artificial graphite layer 310 extended in a plane, the metal layer 320b can additionally provide a z-axis heat conduction path to form a three dimensional space for dissipating the heat energy, such that the heat energy is rapidly conducted to the graphite material layer 320a.

Figure 3C:
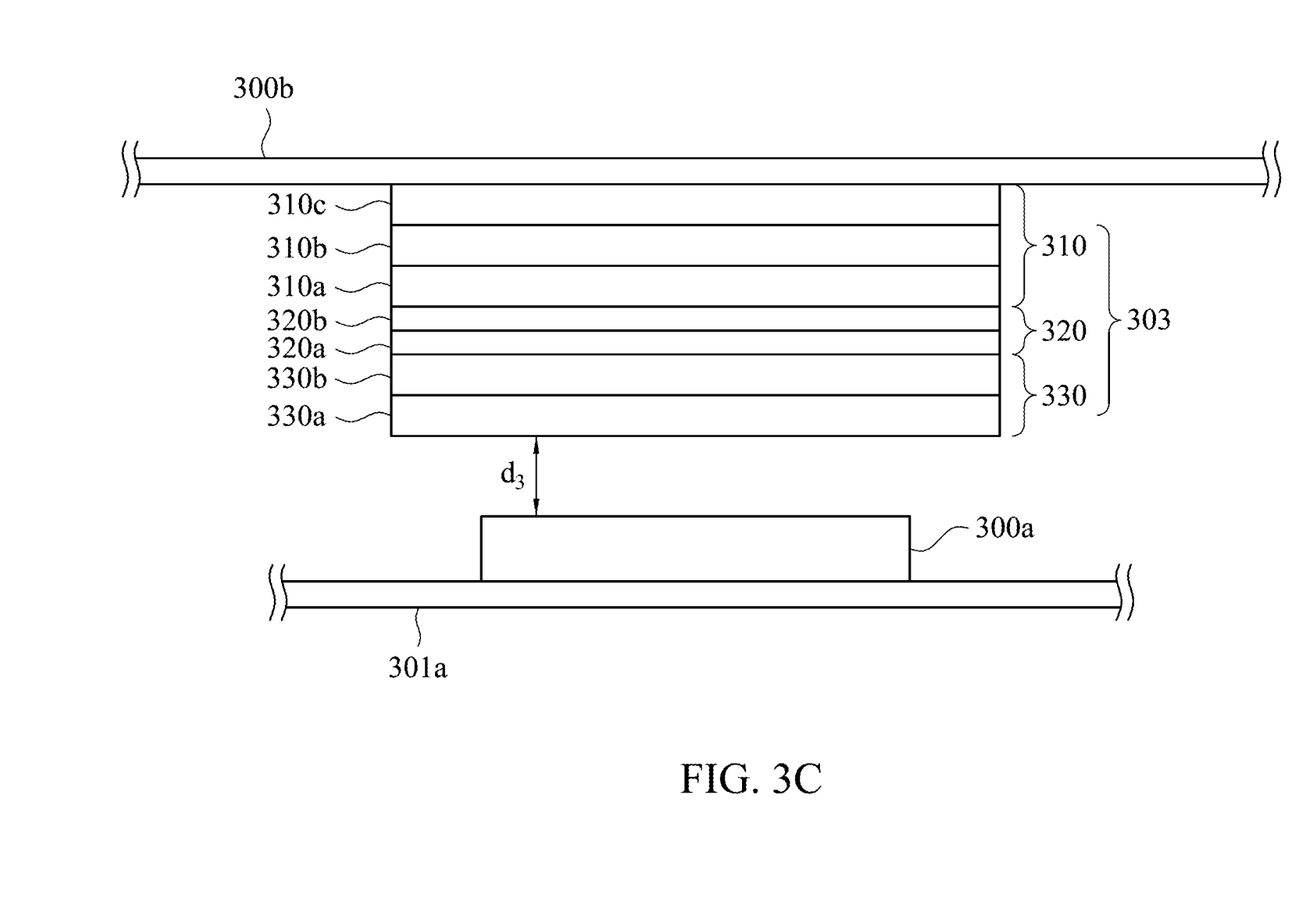

Referring to FIG. 3C, it illustrates a side view schematic of a configuration of the composite heat dissipation material 303, a heating element 300a and a high temperature element 300b according to some embodiments of the present application. The composite heat dissipation material 303 is substantially the same as the aforementioned composite heat dissipation material 302 in construction. Differences between those are that the composite heat dissipation material 303 includes another artificial graphite layer 330, and the artificial graphite layer 330 includes artificial graphite materials 330a and 330b. The graphitic heat dissipation layer 320 is disposed between two artificial graphite layer 310 and 330. There is a distance d3 between the composite heat dissipation material 303 and the heating element 300a.

Because the artificial graphite layer 310 is closer to the heat source (i.e. the high temperature element 300b) than the artificial graphite layer 330, the artificial graphite layer 310 has more layers of artificial graphite materials for providing better heat dissipation efficiency.

In some examples, the heat energy generated from the heat source is rapidly conducted by the composite heat dissipation material of the present application with the stacking of the artificial graphite layer and the graphitic heat dissipation layer, thereby avoiding the damages resulted from high temperature. The bonding between the artificial graphite layer and the graphitic heat dissipation layer can be achieved by an adhesion layer (e.g. heat conduction glue) or interspersing of graphite, such that the heat energy is rapidly conducted through an interface between two layers and is dissipated along x-y plane of the stacked graphite materials.

In some examples, the graphitic heat dissipation layer of the present application has the metal layer. The metal layer facilitates the heat conduction in z-axis of the composite heat dissipation material, thereby subjecting the composite heat dissipation material to be equipped with the three dimensional heat conduction path.

Beside, in other examples, the heat energy generated from the heat source is firstly rapidly dissipated to be conducted along x-y plane, then the heat energy in whole x-y plane is conducted to the graphite material layer of the graphitic heat dissipation layer along z-axis, and further being conducted in x-y plane of the graphite material layer when the artificial graphite layer is disposed between the metal layer and the heat source. Therefore, the composite heat dissipation material of the present application can rapidly dissipate the heat energy instantaneously generated from the heat source to avoid damaging devices.

Several embodiments are described below to illustrate the application of the present application. However, these embodiments are not used for limiting the present application. For those skilled in the art of the present application, various variations and modifications can be made without departing from the spirit and scope of the present application.

Producing Composite Heat Dissipation Material

Embodiment A1-1

A composite heat dissipation material of Embodiment A1-1 was made by stacking 0.012 mm of an insulation film (Mylar) and 0.08 mm of a natural graphite layer (thermal conductivity coefficient was 600 W/mK), and the natural graphite layer of the composite heat dissipation material was bonded to a heat source by 0.02 mm of a double-sided tape. The insulation film was placed between the natural graphite layer and the heat source, and the insulation film had an opening corresponding to a size and a position of the heat source. Therefore, the composite heat dissipation material directly contacted to the heat source with the double-sided tape. Besides, the other side of the composite heat dissipation material opposite to the side adhered the double-sided tape was adhered with a single-sided tape (thickness was 0.01 mm) to protect the natural graphite layer.

Figure 4A:
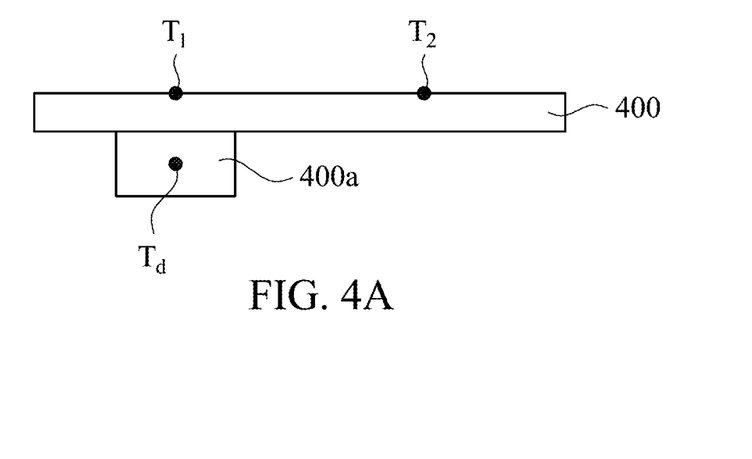
FIG. 4A illustrates a configuration for evaluating heat dissipation efficiency of the composite heat dissipation material according to some embodiments of the present application.
Figure 4B:
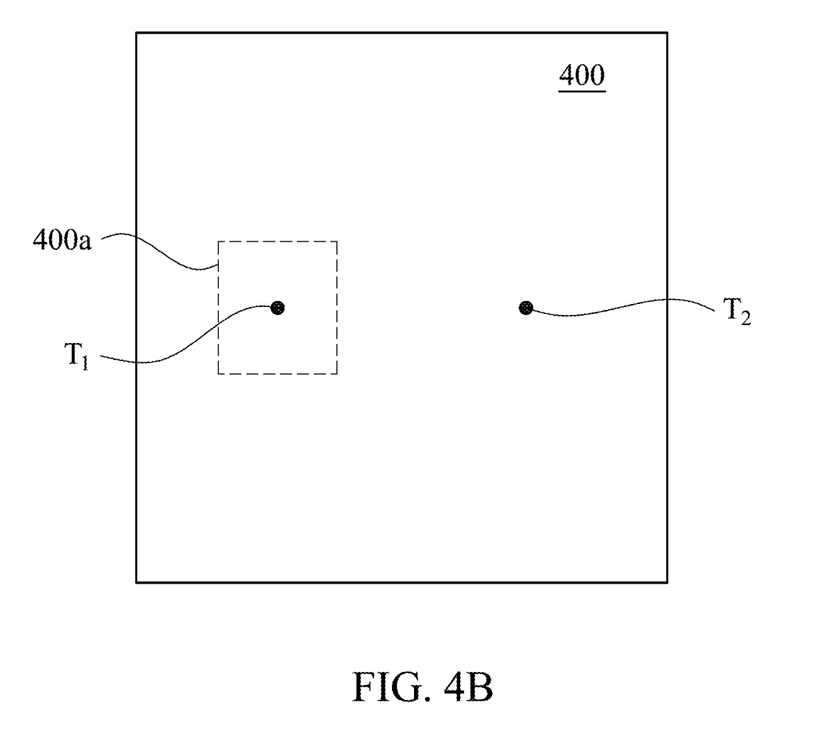
FIG. 4B illustrates a top view schematic of the configuration of FIG. 4A.

As the configurations of FIG. 4A and FIG. 4B, FIG. 4A illustrated a side view schematic of a configuration for evaluating heat dissipation efficiency of the composite heat dissipation material, and FIG. 4B illustrated a top view schematic of the configuration of FIG. 4A. Length and width of the composite heat dissipation material 400 of Embodiment A1-1 were both 100 mm, and length and width of the heating element 400a were both 25 mm. There was a distance between the heating element 400a and an edge of the composite heat dissipation material 400 was 11 mm, and length and width of the square opening of the insulation film both were 28 mm. A temperature-detecting position $T_d$ was at center of the heating element 400a, a temperature-detecting position $T_1$ was over the temperature-detecting position $T_d$, and a distance from a temperature-detecting position $T_2$ to the temperature-detecting position $T_1$ was 64 mm.

Ambient temperature of Embodiment A1-1 was 26.6° C., saturation temperature of the temperature-detecting positions $T_d$, $T_1$ and $T_2$ respectively were 82.9° C., 71.7° C. and 40.2° C., and saturation temperature difference of the temperature-detecting positions $T_d$, $T_1$ and $T_2$ respectively were 56.3° C., 45.1° C. and 13.6° C. The saturation temperature difference was a difference value of the saturation temperature of each temperature-detecting positions and the ambient temperature.

Embodiment A1-2

The composite heat dissipation material of Embodiment A1-2 was substantially the same as the composite heat dissipation material of Embodiment A1-1. Differences between those were that the composite heat dissipation material of Embodiment A1-2 further included an artificial graphite layer, and the artificial graphite layer was disposed between the natural graphite layer and the insulation film. Thickness of the artificial graphite layer was 0.04 mm, and thermal conductivity coefficient thereof was 1350 W/mK. A double-sided tape having thickness of 0.005 mm was disposed between the artificial graphite layer and the natural graphite layer.

Temperature detecting of Embodiment A1-2 was evaluated with the same method as Embodiment A1-1, and the evaluation results were shown in Table 1 rather than focusing or mentioning them in details.

Embodiment A1-3-1

The composite heat dissipation material of Embodiment A1-3-1 was substantially the same as the composite heat dissipation material of Embodiment A1-2. Differences between those were that the composite heat dissipation material of Embodiment A1-3-1 further included an another artificial graphite layer. The another artificial graphite layer was placed between the natural graphite layer and the artificial graphite layer (i.e. two layers of the artificial graphite layers were disposed between the natural graphite layer and the insulation film). The another artificial graphite layer had thickness of 0.04 mm and thermal conductivity coefficient of 1350 W/mK. A double-sided tape having thickness of 0.005 mm was disposed between the artificial graphite layer and the natural graphite layer.

Temperature detecting of Embodiment A1-3-1 was evaluated with the same method as Embodiment A1-1, and the evaluation results were shown in Table 1 rather than focusing or mentioning them in details.

Embodiment A1-3-2

The composite heat dissipation material of Embodiment A1-3-2 was substantially the same as the composite heat dissipation material of Embodiment A1-2. Differences between those were that the composite heat dissipation material of Embodiment A1-3-2 further included an another artificial graphite layer. The another artificial graphite layer was disposed between the natural graphite layer and a single-sided tape (i.e. the natural graphite layer was disposed between the two artificial graphite layers). The another artificial graphite layer had thickness of 0.04 mm and thermal conductivity coefficient of 1350 W/mK. A double-sided tape having thickness of 0.005 mm was disposed between the artificial graphite layer and the natural graphite layer.

Temperature detecting of Embodiment A1-3-2 was evaluated with the same method as Embodiment A1-1, and the evaluation results were shown in Table 1 rather than focusing or mentioning them in details.

Embodiment A1-4

The composite heat dissipation material of Embodiment A1-4 was substantially the same as the composite heat dissipation material of Embodiment A1-3-1. Differences between those were that the composite heat dissipation material of Embodiment A1-4 further included an another artificial graphite layer. The another artificial graphite layer was disposed between the natural graphite layer and a single-sided tape (i.e. the natural graphite layer was disposed between the two artificial graphite layers). The another artificial graphite layer had thickness of 0.0025 mm and thermal conductivity coefficient of 1500 W/mK. A double-sided tape having thickness of 0.005 mm was disposed between the artificial graphite layer and the natural graphite layer.

Temperature detecting of Embodiment A1-4 was evaluated with the same method as Embodiment A1-1, and the evaluation results were shown in Table 1 rather than focusing or mentioning them in details.

Embodiment A1-5

The composite heat dissipation material of Embodiment A1-5 was substantially the same as the composite heat dissipation material of Embodiment A1-1. Differences between those were that the natural graphite layer in the composite heat dissipation material of Embodiment A1-5 was replaced with an artificial graphite layer (thickness was 0.04 mm, and thermal conductivity coefficient was 1350 W/mK). Temperature detecting of Embodiment A1-5 was evaluated with the same method as Embodiment A1-1, and the evaluation results were shown in Table 1 rather than focusing or mentioning them in details.

Embodiment A2-1 to Embodiment A2-4

The composite heat dissipation material of Embodiment A2-1, Embodiment A2-2, Embodiment A2-3 and Embodiment A2-4 were respectively substantially the same as that of Embodiment A1-1, Embodiment A1-2, Embodiment A1-3-1 and Embodiment A1-4. Differences between those were that the thickness of the natural graphite layer Embodiments A2-1 to A2-4 was adjusted from 0.08 mm to 0.124 mm. Temperature detecting of Embodiments A2-1 to A2-4 was evaluated with the same method as Embodiment A1-1, and the evaluation results were shown in Table 1 rather than focusing or mentioning them in details.

Embodiment A3-1 to Embodiment A3-4

The composite heat dissipation material of Embodiment A3-1, Embodiment A3-2, Embodiment A3-3 and Embodiment A3-4 were respectively substantially the same as that of Embodiment A1-1, Embodiment A1-2, Embodiment A1-3-1 and Embodiment A1-4. Differences between those were that the thickness of the natural graphite layer in Embodiments A3-1 to A3-4 was adjusted from 0.08 mm to 0.19 mm. Temperature detecting of Embodiments A3-1 to A3-4 was evaluated with the same method as Embodiment A1-1, and the evaluation results were shown in Table 1 rather than focusing or mentioning them in details.

TABLE 1

|  | saturation temp. (° C.) | | | ambient | saturation temp. difference(° C.) | | | |
| --- | --- | --- | --- | --- | --- | --- | --- | --- |
|  | $T_d$ | $T_1$ | $T_2$ | temp. (° C.) | $T_d$ | $T_1$ | $T_2$ | $T_1 - T_2$ |
| Embodiment A1-1 | 82.9 | 71.7 | 40.2 | 26.6 | 56.3 | 45.1 | 13.6 | 31.5 |
| Embodiment A1-2 | 73.3 | 62.3 | 44.1 | 26.8 | 46.5 | 35.5 | 17.3 | 18.2 |
| Embodiment A1-3-1 | 70.6 | 59.2 | 46.1 | 26.6 | 44.0 | 32.6 | 19.5 | 13.1 |
| Embodiment A1-3-2 | 71.1 | 60.0 | 47.0 | 26.7 | 44.4 | 33.3 | 20.3 | 13.0 |
| Embodiment A1-4 | 69.9 | 58.2 | 47.1 | 27.0 | 42.9 | 31.2 | 20.1 | 11.1 |
| Embodiment A1-5 | 78.7 | 68.1 | 40.0 | 24.6 | 54.1 | 43.5 | 15.4 | 28.1 |
| Embodiment A2-1 | 74.6 | 63.8 | 40.7 | 24.5 | 50.1 | 39.3 | 16.2 | 23.1 |
| Embodiment A2-2 | 72.0 | 61.1 | 45.1 | 27.1 | 44.9 | 34.0 | 18.0 | 16.0 |
| Embodiment A2-3 | 70.3 | 58.8 | 47.3 | 26.9 | 43.4 | 31.9 | 20.4 | 11.5 |
| Embodiment A2-4 | 69.0 | 57.9 | 47.8 | 27.2 | 41.8 | 30.7 | 20.6 | 10.1 |
| Embodiment A3-1 | 73.3 | 64.1 | 44.8 | 27.4 | 45.9 | 36.7 | 17.4 | 19.3 |
| Embodiment A3-2 | 70.9 | 60.0 | 47.0 | 27.1 | 43.8 | 32.9 | 19.9 | 13.0 |
| Embodiment A3-3 | 65.0 | 55.9 | 43.9 | 22.8 | 42.2 | 33.1 | 21.1 | 12.0 |
| Embodiment A3-4 | 68.0 | 56.4 | 47.7 | 27.2 | 40.8 | 29.2 | 20.5 | 8.7 |

Embodiment B1-1 to Embodiment B1-4

The composite heat dissipation material of Embodiment B1-1, Embodiment B1-2, Embodiment B1-3-1, Embodiment B1-3-2 and Embodiment B1-4 were respectively substantially the same as that of Embodiment A1-1, Embodiment A1-2, Embodiment A1-3-1, Embodiment A1-3-2 and Embodiment A1-4. Differences between those were that the natural graphite layer in Embodiments B1-1 to B1-4 was replaced with a graphitic heat dissipation layer (including a graphite material layer and a metal layer disposed between the heat source and the graphite material layer). Thickness and thermal conductivity coefficient of the graphitic heat dissipation layer were the same as the natural graphite layer. Temperature detecting of Embodiments B1-1 to B1-4 was evaluated with the same method as Embodiment A1-1, and the evaluation results were shown in Table 2 rather than focusing or mentioning them in details.

Embodiment B2-1 to Embodiment B2-4

The composite heat dissipation material of Embodiment B2-1, Embodiment B2-2, Embodiment B2-3 and Embodiment B2-4 were respectively substantially the same as that of Embodiment A2-1, Embodiment A2-2, Embodiment A2-3 and Embodiment A2-4. Differences between those were that the natural graphite layer in Embodiments B2-1 to B2-4 was replaced with a graphitic heat dissipation layer (including a graphite material layer and a metal layer disposed between the heat source and the graphite material layer). Thickness and thermal conductivity coefficient of the graphitic heat dissipation layer were the same as the natural graphite layer. Temperature detecting of Embodiments B2-1 to B2-4 was evaluated with the same method as Embodiment A1-1, and the evaluation results were shown in Table 2 rather than focusing or mentioning them in details.

Embodiment B3-1 to Embodiment B3-4

The composite heat dissipation material of Embodiment B3-1, Embodiment B3-2, Embodiment B3-3 and Embodiment B3-4 were respectively substantially the same as that of Embodiment A3-1, Embodiment A3-2, Embodiment A3-3 and Embodiment A3-4. Differences between those were that the natural graphite layer in Embodiments B3-1 to B3-4 was replaced with a graphitic heat dissipation layer (including a graphite material layer and a metal layer disposed between the heat source and the graphite material layer). Thickness and thermal conductivity coefficient of the graphitic heat dissipation layer were the same as the natural graphite layer. Temperature detecting of Embodiments B3-1 to B3-4 was evaluated with the same method as Embodiment A1-1, and the evaluation results were shown in Table 2 rather than focusing or mentioning them in details.

TABLE 2

|  | saturation temp. (° C.) | | | ambient | saturation temp. difference(° C.) | | | |
| --- | --- | --- | --- | --- | --- | --- | --- | --- |
|  | $T_d$ | $T_1$ | $T_2$ | temp. (° C.) | $T_d$ | $T_1$ | $T_2$ | $T_1 - T_2$ |
| Embodiment B1-1 | 82.5 | 71.5 | 40.2 | 26.6 | 55.9 | 44.9 | 13.6 | 31.3 |
| Embodiment B1-2 | 73.0 | 62.1 | 44.1 | 26.8 | 46.2 | 35.3 | 17.3 | 18.0 |
| Embodiment B1-3-1 | 70.3 | 59.0 | 46.1 | 26.6 | 43.7 | 32.4 | 19.5 | 12.9 |
| Embodiment B1-3-2 | 70.8 | 59.8 | 47.0 | 26.7 | 44.1 | 33.1 | 20.3 | 12.8 |
| Embodiment B1-4 | 69.6 | 58.0 | 47.1 | 27.0 | 42.6 | 31.0 | 20.1 | 10.9 |
| Embodiment B1-5 | 78.7 | 68.1 | 40.0 | 24.6 | 54.1 | 43.5 | 15.4 | 28.1 |
| Embodiment B2-1 | 74.2 | 63.5 | 40.7 | 24.5 | 49.7 | 39.0 | 16.2 | 22.8 |
| Embodiment B2-2 | 71.7 | 60.9 | 45.1 | 27.1 | 44.6 | 33.8 | 18.0 | 15.8 |
| Embodiment B2-3 | 70.0 | 58.5 | 47.3 | 26.9 | 43.1 | 31.6 | 20.4 | 11.2 |
| Embodiment B2-4 | 68.8 | 57.7 | 47.8 | 27.2 | 41.6 | 30.5 | 20.6 | 9.9 |
| Embodiment B3-1 | 73.1 | 63.9 | 44.8 | 27.4 | 45.7 | 36.5 | 17.4 | 19.1 |
| Embodiment B3-2 | 70.6 | 59.7 | 47.0 | 27.1 | 43.5 | 32.6 | 19.9 | 12.7 |
| Embodiment B3-3 | 64.8 | 55.7 | 43.9 | 22.8 | 42.0 | 32.9 | 21.1 | 11.8 |
| Embodiment B3-4 | 67.8 | 56.2 | 47.7 | 27.2 | 40.6 | 29.0 | 20.5 | 8.5 |

Figure 5A:
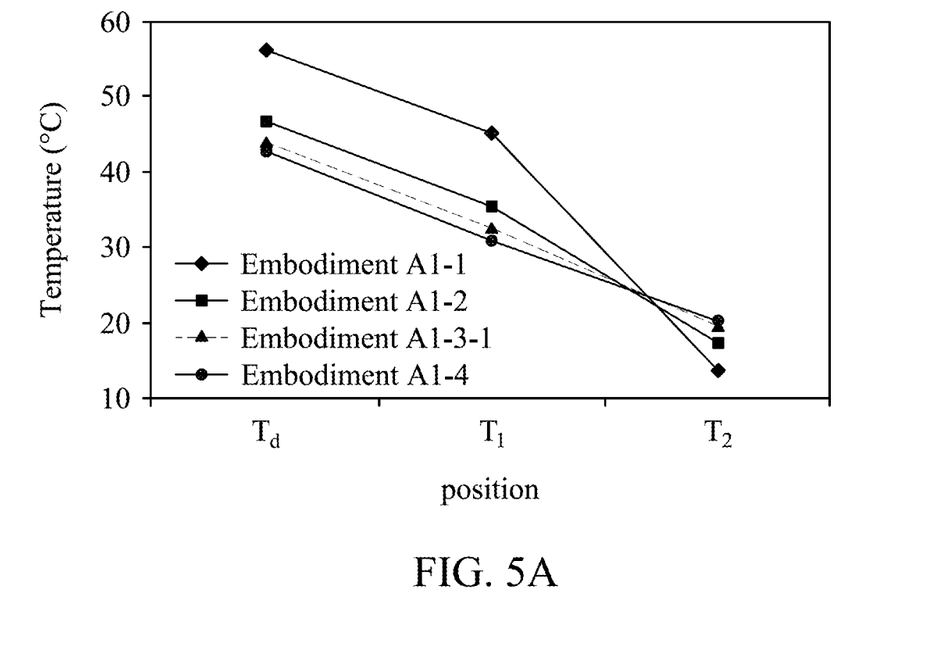
FIG. 5A to FIG. 5C and FIG. 6A to FIG. 6C respectively illustrates a line chart of temperature of various temperature-detecting positions of the composite heat dissipation material of the present application while the heat dissipation efficiency is evaluated by the configuration of FIG. 4A.
Figure 5B:
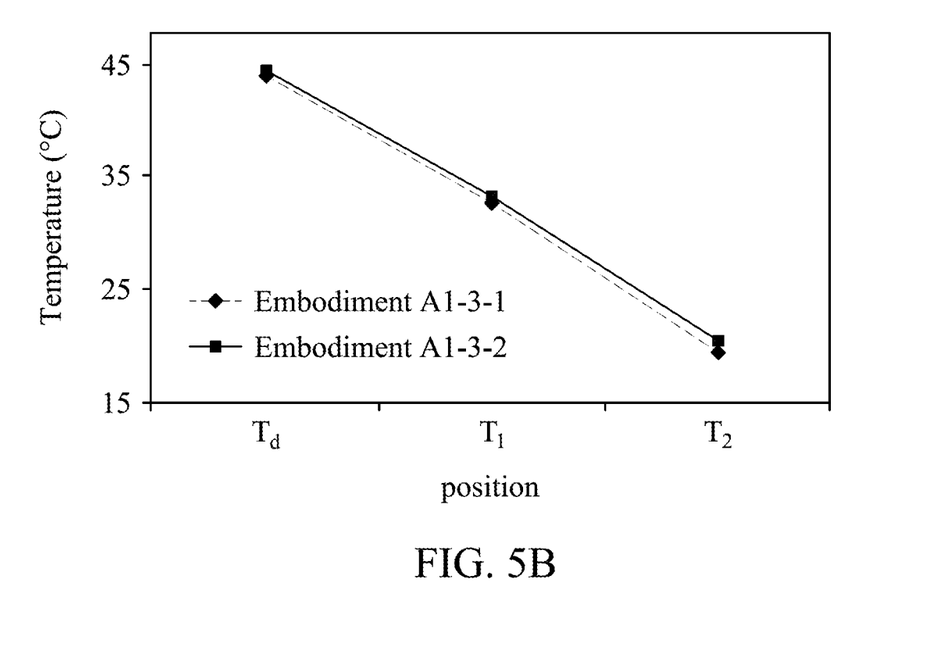
Figure 5C:
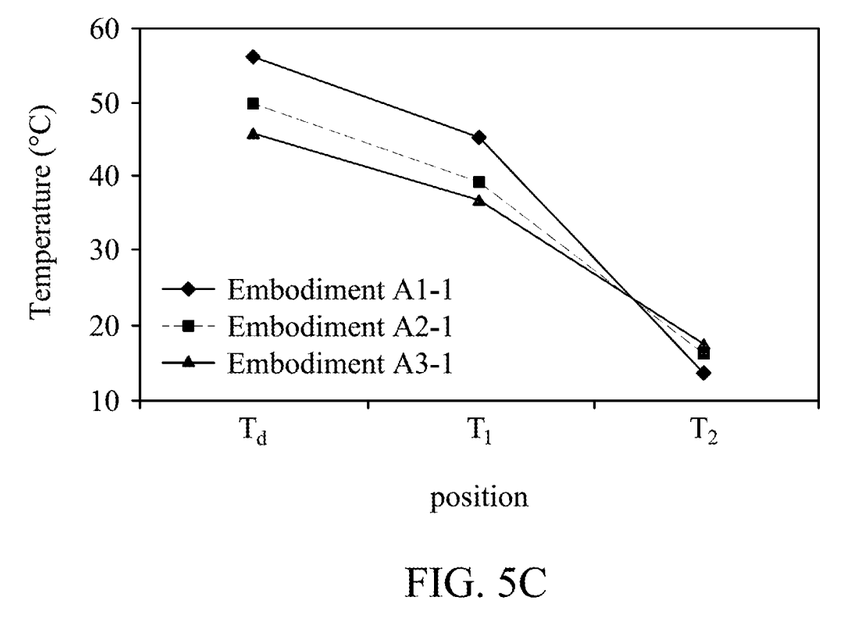
Figure 6A:
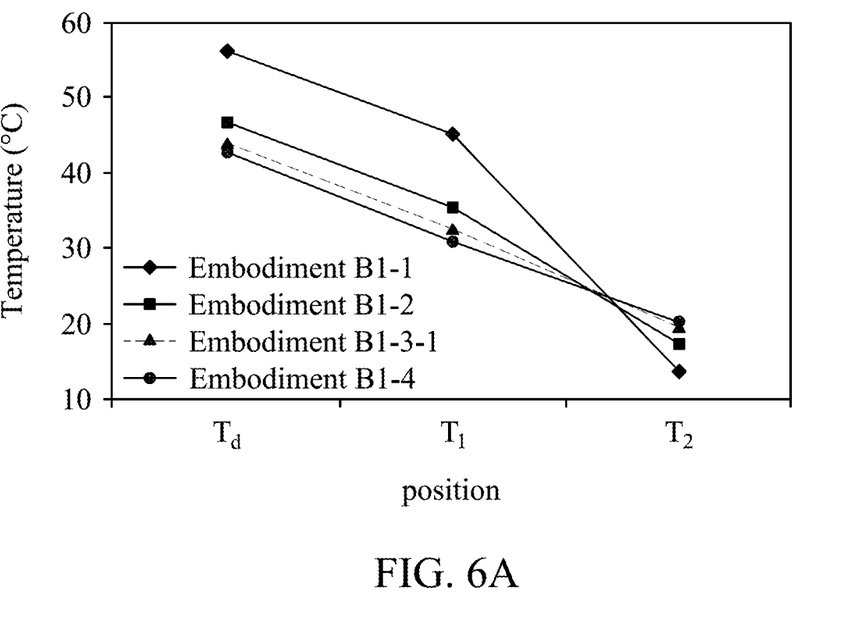
Figure 6B:
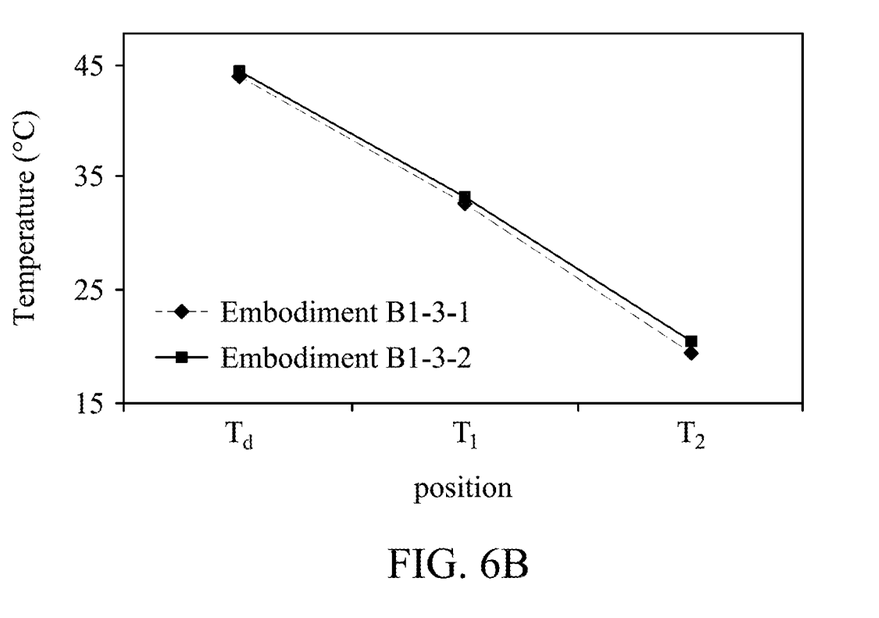
Figure 6C:
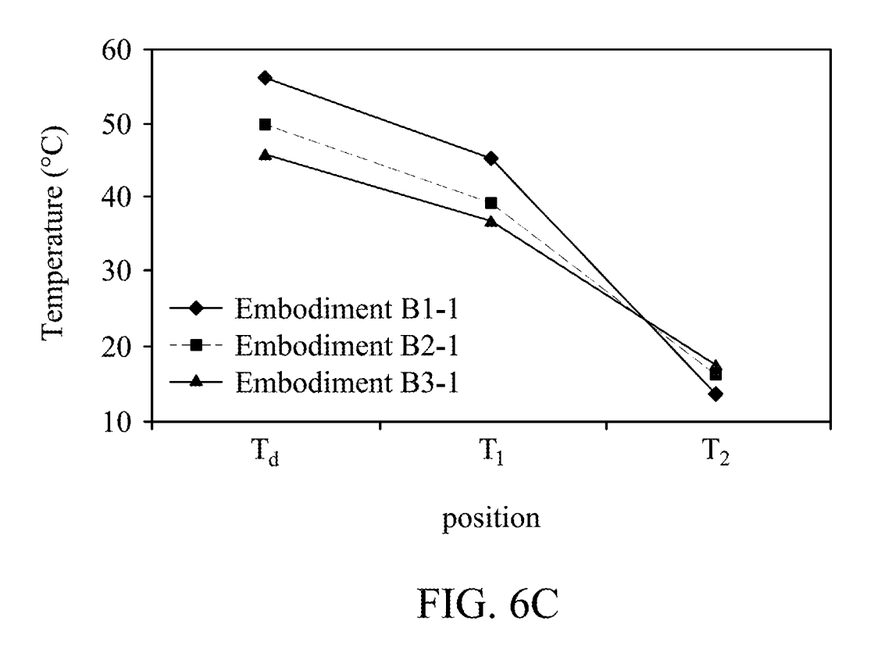

Referring to FIG. 5A and FIG. 6A. When numbers of layers of the artificial graphite layer in the composite heat dissipation material are increased, temperature of the temperature-detecting position $T_2$ is higher. Accordingly, the heat energy generated from the heat source had been conducted to a farther position, such that the composite heat dissipation material has better heat dissipation efficiency for the heat source. Moreover, shown as FIG. 5B and FIG. 6B, when there was more artificial graphite layers between the natural graphite layer (or the graphitic heat dissipation layer) and the heat source, the composite heat dissipation material could have much better heat dissipation efficiency as an increasing of numbers of the artificial graphite layers because the heat energy generated from the heat source could be efficiently dissipated by the artificial graphite layers. Besides, referring to FIG. 5C and FIG. 6C, the heat dissipation efficiency of the composite heat dissipation material could be enhanced when the thickness of the natural graphite layer or the graphitic heat dissipation layer was increased. Therefore, the heat source could be efficiently cooled.

Therefore, the composite heat dissipation material of the present application can efficiently dissipate the heat energy generated from the heat source with the configuration of the artificial graphite layer and the graphitic heat dissipation layer. The heat dissipation efficiency of the composite heat dissipation material can be efficiently adjusted and controlled by varying the numbers of layers of the artificial graphite layers and/or the thickness of the graphitic heat dissipation layer, thereby preventing the heat source from damages due to high temperature and meeting the thinning development trend.

As is understood by a person skilled in the art, the foregoing preferred embodiments of the present application are illustrated of the present application rather than limiting of the present application. In view of the foregoing, it is intended to cover various modifications and similar arrangements included within the spirit and scope of the appended claims. Therefore, the scope of which should be accorded the broadest interpretation so as to encompass all such modifications and similar structure.

What is claimed is:

1. A composite heat dissipation material, comprising:
   at least one first artificial graphite layer;
   at least one second artificial graphite layer; and
   a graphitic heat dissipation layer, comprising a graphite material layer, wherein the graphitic heat dissipation layer is disposed between the at least one first artificial graphite layer and the at least one second artificial graphite layer, the graphite material layer is not formed from an artificial graphite material, and the graphitic heat dissipation layer is scarfed with one of the at least one first artificial graphite layer and one of the at least one second artificial graphite layer by interspersing graphite, and
   wherein a difference value between a thermal conductivity coefficient of the graphite material layer and a thermal conductivity coefficient of each of the at least one first artificial graphite layer is not less than 100 w/mK, and wherein the composite heat dissipation material is configured to dissipate heat energy generated from a heat source, the at least one second artificial graphite layer is disposed between the heat source and the graphitic heat dissipation layer, and a number of layers of the at least one second artificial graphite layer is more than a number of layers of the at least one first artificial graphite layer.

2. The composite heat dissipation material of claim 1, wherein the graphite material layer is formed from a natural graphite material.

3. The composite heat dissipation material of claim 1, wherein the graphitic heat dissipation layer further includes a metal layer.

4. The composite heat dissipation material of claim 3, wherein the metal layer is disposed adjacent to the at least one second artificial graphite layer.

5. The composite heat dissipation material of claim 1, wherein the number of layers of the at least one first artificial graphite layer is not more than eight.

6. The composite heat dissipation material of claim 1, further comprising:
at least one adhesion layer, wherein the at least one adhesion layer is disposed between the heat source and the composite heat dissipation material.

7. The composite heat dissipation material of claim 6, wherein each of the at least one adhesion layer includes a heat conduction material.

8. A composite heat dissipation material, comprising:
at least one first artificial graphite layer;
at least one second artificial graphite layer; and
a graphitic heat dissipation layer, comprising a graphite material layer, wherein the graphitic heat dissipation layer is disposed between the at least one first artificial graphite layer and the at least one second artificial graphite layer, the graphite material layer is not formed from an artificial graphite material, the graphitic heat dissipation layer is bonded to one of the at least one first artificial graphite layer and one of the at least one second artificial graphite layer, and the graphitic heat dissipation layer is scarfed with the one of the at least one second artificial graphite layer by interspersing graphite, and
wherein a difference value between a thermal conductivity coefficient of the graphite material layer and a thermal conductivity coefficient of each of the at least one first artificial graphite layer is not less than 100 w/mK, and
wherein a number of layers of the at least one second artificial graphite layer is more than a number of layers of the at least one first artificial graphite layer.

9. The composite heat dissipation material of claim 8, wherein the graphite material layer is formed from a natural graphite material.

10. The composite heat dissipation material of claim 8, wherein the graphitic heat dissipation layer further includes a metal layer.

11. The composite heat dissipation material of claim 10, wherein the metal layer is disposed adjacent to the at least one second artificial graphite layer.

12. The composite heat dissipation material of claim 8, wherein the graphitic heat dissipation layer is scarfed with the one of the at least one first artificial graphite layer by interspersing graphite.

* * * * *